United States Patent [19]

Kleinhans

[11] Patent Number: 5,063,352

[45] Date of Patent: Nov. 5, 1991

[54] CIRCUIT ARRANGEMENT WITH A FLOW PROBE OPERATED IN A BRIDGE CIRCUIT

[75] Inventor: Josef Kleinhans, Vaihingen, Enz, Fed. Rep. of Germany

[73] Assignee: Robert Bosch GmbH, Stuttgart, Fed. Rep. of Germany

[21] Appl. No.: 473,949

[22] PCT Filed: Dec. 13, 1988

[86] PCT No.: PCT/DE88/00761

§ 371 Date: Feb. 9, 1990

§ 102(e) Date: Feb. 9, 1990

[87] PCT Pub. No.: WO89/07242

PCT Pub. Date: Aug. 10, 1989

[30] Foreign Application Priority Data

Feb. 6, 1988 [DE] Fed. Rep. of Germany ....... 3803609

[51] Int. Cl.[5] ........................................... G01R 27/08
[52] U.S. Cl. ................................... 324/706; 324/607;
324/610; 324/712; 324/725
[58] Field of Search ............... 324/706, 712, 725, 673,
324/680, 607, 610; 73/204.14, 204.15, 204.23,
204.25, 116, 118.2

[56] References Cited

U.S. PATENT DOCUMENTS

| | | | |
|---|---|---|---|
| 3,845,385 | 10/1974 | Ebrecht | 324/610 |
| 3,928,800 | 12/1975 | Strenglein | 73/204.14 X |
| 4,043,195 | 8/1977 | Hunting | 73/204.14 |
| 4,884,215 | 11/1989 | Zboralski et al. | 73/204.14 X |

FOREIGN PATENT DOCUMENTS 0007288  7/1979 European Pat. Off. .
0078427 10/1982 European Pat. Off. .
3608538  9/1987 Fed. Rep. of Germany .

Primary Examiner—Kenneth A. Wieder
Assistant Examiner—Robert W. Mueller
Attorney, Agent, or Firm—Michael J. Striker

[57] ABSTRACT

In the case of a circuit arrangement with a flow probe operated in a bridge circuit, a device for determining bridge balance, which controls a triggering circuit which can be supplied by an oscillator and controls a switching device for the power supply of the bridge circuit, the oscillator has an operating frequency which is at least approximately inversely proportional to the square of the operating voltage of the power supply.

9 Claims, 6 Drawing Sheets

CIRCUIT ARRANGEMENT WITH A FLOW PROBE OPERATED IN A BRIDGE CIRCUIT

BACKGROUND OF THE INVENTION

1. Prior Art

The invention relates to a circuit arrangement with a flow probe operated in a bridge circuit, a device for determining bridge balance, which controls a flip flop circuit which can be supplied by an oscillator and controls a switching device for the power supply of the bridge circuit, as is known for example from German Offenlegungsschrift 3,608,538. In the case of the known circuit arrangement, the flow probe is designed as a hot-wire flow probe, the output signal of which is proportional to an operating voltage. The diagonal voltage of the bridge circuit, in which the flow probe is arranged, is fed to the input terminals of a comparator, the output terminal of which is connected to an input of the bistable flip flop stage, the output of which controls a transistor, which applies the operating voltage to an integrator circuit to upon closing of a switch. With the known circuit arrangement, it is to be achieved that an otherwise necessary high-precision voltage reference source in a control unit which evaluates the output signal can be dispensed with. The output frequency of the known circuit arrangement lies in the range between 1 and 10 kHz.

A circuit arrangement for the digitization of an analog signal derived from a measuring probe with a voltage-frequency converter, in which an electrical control device for a fuel injection for internal-combustion engines is provided with an air flowmeter, in which a resistor arranged in a bridge circuit has a heating current passed through it, has become known for example from German Patent Specification 2,448,304. The heating current has a direct-current component and a superimposed alternating-current component, which consists of heating-current pulses of constant duration, the pulse repetition frequency varying as a function of the air flow. To a diagonal of the bridge circuit there is connected an operational amplifier, the output voltage of which is converted with a voltage-frequency converter into a frequency proportional to the quantity of air taken in, which on the one hand controls the alternating current fed to the bridge circuit and on the other hand serves indirectly as controlled variable of the electronic control device for fuel injection metering. The output frequency of the voltage-frequency converter is subjected to a linearization function, which can be realized for instance by a squaring circuit. With this circuit arrangement, a further processing of the pulse repetition frequency signal corresponding to the quantity of air taken in is to be performed in a digital way.

In German Offenlegungsschrift 3 ,037,340, a driver for a hot-wire air flowmeter is described, which has a hot wire for the radiation of heat into an air stream and a resistor for temperature compensation. The voltage, drop at the hot wire is compared with the voltage drop dropping at the compensating resistor. This voltage drop drop difference is integrated and the integrated voltage signal is subjected to a second comparison with the output voltage of a sawtooth generator. On the basis of the result of this second comparison, the pulse duty factor of the constant current through the hot wire is controlled such that the difference between the temperature of the hot wire and the temperature of the compensating resistor is constant. In the case of this known circuit, two constant-current sources are necessary for the feeding of constant currents into the hot wire and into the compensating resistor, respectively.

2. Advantages of the invention

The circuit arrangement according to the invention, with a flow probe operated in bridge circuit, a device for determining bridge balance, which controls a triggering circuit which can be supplied by an oscillator and controls a switching device for the power supply of the bridge circuit, in which the oscillator has an operating frequency which is at least approximately inversely proportional to the square of the operating voltage of the power supply has, in particular, the advantage that now only semiconductors are necessary for switching control, the power of which may be lower than in the case of the prior art. The circuit arrangement according to the invention is therefore less susceptible to faults, is of simpler design and is therefore less expensive. The output signal of the circuit arrangement according to the invention is a pulse duty factor, and this allows a direct evaluation of the output signal in digital control units. The output signal is in dependant of the supply voltage and is therefore also not influenced by any fluctuations of the supply voltage (operating voltage).

SUMMARY OF THE INVENTION

According to the invention, there is provided for the generation of the operating frequency a circuit in which a first comparator circuit and a second comparator circuit are provided, which are connected in each case with one input to a capacitance and with the other input to a first a flip-flop circuit for of the delivery of the operating frequency being operable by t first comparator circuit and a power supply circuit for charging the capacitance being operable by the second comparator circuit. In this way, the desired inverse proportionality between the output frequency and the square of the operating voltage can be easily established, it being possible for the control semiconductor to have a considerably reduced power in comparison with an analog control.

Advantageously, a voltage proportional to the operating voltage can be delivered from the first voltage source and a voltage proportional to a reference voltage can be delivered from the second voltage source, and the second comparator circuit is followed by an integrator circuit, the output signal of which drives a controllable power source, the output of which is connected to the capacitance, a switching element for discharging the capacitance being operable by the triggering circuit. The multivibrator circuit is preferably a monostable triggering circuit (monoflop).

Since, with use of a simple transistor switching stage as a switching device for the circuit arrangement according to the invention the saturation voltage of this transistor in the activated state would influence the operating behavior of the circuit arrangement, a voltage flower including which has an operational amplifier with a series connected transistor is advantageously provided as switching device. The voltage follower switches a voltage proportional to the operating voltage, on a level just below the difference between the operating voltage and the saturation voltage of the transistor. As a result, disturbing influences, which could otherwise endanger the desired inverse proportionality between the operating frequency and the square of the operating voltage, can be avoided in a simple way.

Advantageously, there is provided for the generation of a frequency inversely proportional to the square of the operating voltage a voltage-controlled oscillator, to which a control circuit is connected, from which a control signal can be delivered to the oscillator for influencing the duration of the turn-on pulses of the oscillator as a function of the level of the operating voltage. The interval of the turn-on edges of the turn-on pulses, determining the frequency, therefore remains unchanged, whereas the duration of the turn-on pulses varies by corresponding shifting of the turn-off edges of the turn-on pulses as a function of the level of the operating voltage.

In this arrangement there is preferably provided a differential integrating element, connected to the bridge circuit, the output of which element is connected to the input of the oscillator.

In order to be able in a simple way to vary the duration of the turn-on pulses of the oscillator as a function of the level of the operating voltage, resistor networks with comparator circuits are advantageously provided. Such resistor networks can be constructed simply, inexpensively and with precision. By different designing of the resistor networks, the approximation of a value inversely proportional to the square of the operating voltage can be achieved in different ways; in the case of a particularly advantageous design of the invention, this approximation is performed via functions which are proportional to the reciprocal of the operating voltage.

The invention is explained in more detail below with reference to preferred exemplary embodiments illustrated in the drawing.

BRIEF DESCRIPTION OF THE DRAWING

FIG. 1A shows a timing diagram for the circuit of FIG. 1;

FIG. 3a is a table of switching states of the device of FIG. 3;

FIG. 6a is a plot diagram of the switch-on time $T_M$ vs. operating voltage $U_B$ of the monoflop of FIG. 6;

and FIG. 7a is a plot diagram of the switch-on function of the device of FIG. 7.

DESCRIPTION OF THE EXEMPLARY EMBODIMENTS

The exemplary embodiments involve circuit arrangements for flow probes operated in bridge circuit, which can be realized for instance as hot-wire or hot-film air mass meters. In order to make the flow probes independent of fluctuations of the operating voltage $U_B$, the circuit arrangements of FIGS. 1-3 include an oscillator with an operating frequency $f_o$ at least approximately inversely proportional to the square of the operating voltage $U_B$ of a power supply while in the embodiments according to FIGS. 4-7 the duration $T_i$ of the energization pulse for the hot-wire flow probe is set to be at least approximately inversely proportional to the square of the operational voltage $U_B$ ($T_i = c/U_B^2$).

Figure 1:
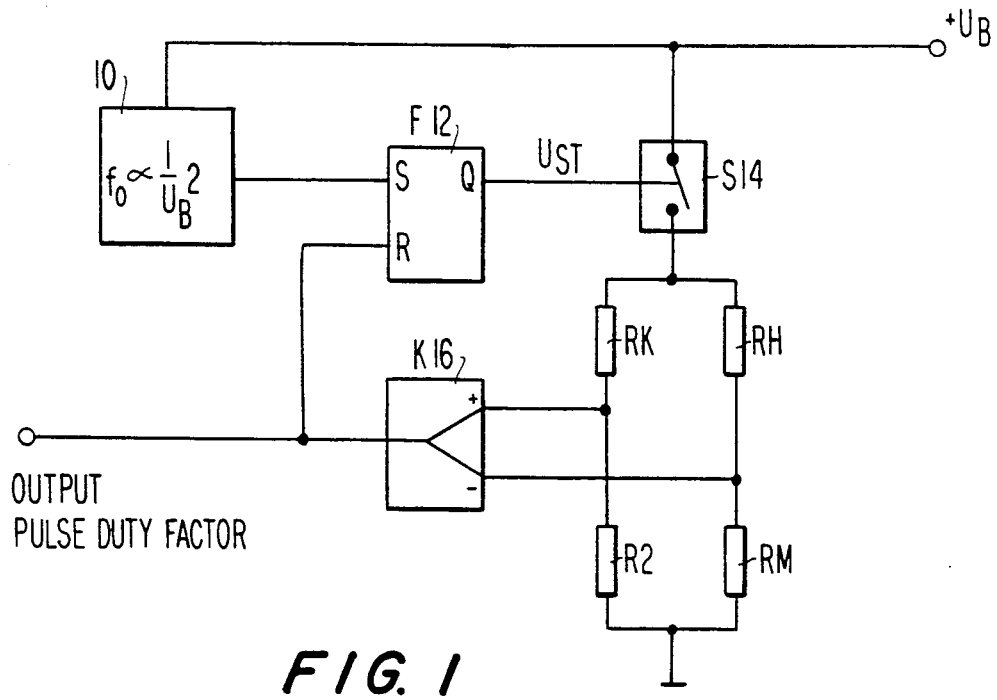
FIG. 1 shows, in a block circuit diagram a greatly simplified embodiment of the invention with an oscillator, the output frequency of which is proportional to the reciprocal of the square of the operating voltage of the circuit arrangement.

In the case of the circuit arrangement according to the invention represented in FIG. 1 schematically greatly simplified in a block circuit diagram, an oscillator 10, supplied by an operating voltage $U_B$, is provided, the output frequency of which oscillator is inversely proportional to the square of this operating voltage. The output of the oscillator 10 is connected to the S input of a flip-flop F12, the Q output of which delivers a control voltage $U_{ST}$ for the operation of a switch S14. The switch S14 is preferably an electronic switching element or switching component. One contact of the switch S14 is connected to the operating voltage $U_B$ and the other contact of this switch is connected to the upper terminal of a bridge circuit of four resistors. In one branch of the bridge circuit, a compensating resistor RK and a balancing resistor R2 are provided, in the other branch a hot-wire or hot-film resistor RH and a precision resistor RM are provided. The lower terminal of the bridge circuit is connected to ground.

The diagonal of this bridge circuit of the four resistors is connected to terminals (+ and − respectively) of a comparator circuit K16, the output of which is connected to a reset input R of the flip-flop F12. At the output of the comparator circuit K16 there is, delivered an output signal, a pulse duty factor of which can be evaluated directly in digital control units.

The operating principle of the circuit arrangement according to the invention represented in FIG. 1 is as specified below:

At the time t=0 the oscillator 10 sets the flip-flop F12, as a result of which the switch S14 is closed. In the unheated state, the hot-wire resistor RH has a lower resistance value than the nominal value in the case of a nominal overtemperature, and therefore the potential at the non-inverting input of the comparator K16 at the time t=0 is lower than at the inverting input. A voltage $U_B$, applied via the switch S14 to the bridge circuit of the four resistors then allows a heating current to flow, which increases the resistance of the resistor RH until the input voltages at the comparator K16 are equal. At this moment, the output of the comparator K16 is switched over and the flip-flop F12 is reset as a result. Via the control voltage $U_{ST}$, emitted from the flip-flop F12, the switch S14 is opened and RH cools again, until the next pulse of the oscillator 10 once again initiates the process specified above. The more the resistor RH is cooled by the air surrounding it, the longer the compensating process lasts. Therefore, the pulse duty factor at the output of the comparator K16 represents a measure of the air flowing around the hot-wire resistor RH.

The following applies for the energy balance at the hot-wire resistor RH:

$$R_H = I_R{}^H = g(\overset{\circ}{m})\Delta T \qquad (1)$$

where $P_H$ denotes the power, $I_H$ the heating current, $g(\overset{\circ}{m})$ a characteristic function and $\Delta T = T_H - T_U$ a temperature difference between two different temperatures $T_H$ and $T_U$, with $T_H > T_U$. For a sufficiently high output frequency $f_o$, the following can be set: $\overline{RH} = RH = $ constant, $\overline{\Delta T} = \Delta T = $ constant.

Because $RK + R2 >> \overline{RH} + RM$, the following applies for $I_H$:

$$I_H = U_B/(\overline{RH} + RM) \qquad (2)$$

With $T_i$ = duration of turn-on condition switch of S14 and $T_o = 1/f_o$, the following applies for the average power $P_H$-consumed at the hot-wire resistor:

$$\overline{P_H} = \frac{T_i}{T_o} \cdot \frac{U_B{}^2}{(\overline{RH} + RM)^2} \overline{RH} = g(\overset{\circ}{m})\Delta T \qquad (3)$$

If the constants are combined, the following pulse duty factor is obtained:

$$\frac{T_i}{T_o} = k g(\overset{\circ}{m}) \frac{1}{U_B{}^2} \qquad (4)$$

with $k = \overline{\Delta T} \dfrac{(\overline{RH} + RM)^2}{\overline{RH}}$

It becomes clear that for the a prior art pulse duty factor $T_I/T_o$ there is an undesired dependence on the operating voltage $U_B$. According to the present invention this dependence is eliminated however if $f_o = 1/T_o$ is chosen proportional to $1/U_b{}^2$. As seen in FIG. 1A, the time intervals $T_o$ between the turn-on edges of the pulse of the output signal $f_0$ of the voltage-controlled oscillator 10 vary as a function $f(U_B) = c \cdot U_B{}^2$ of the operating voltage.

Figure 2:
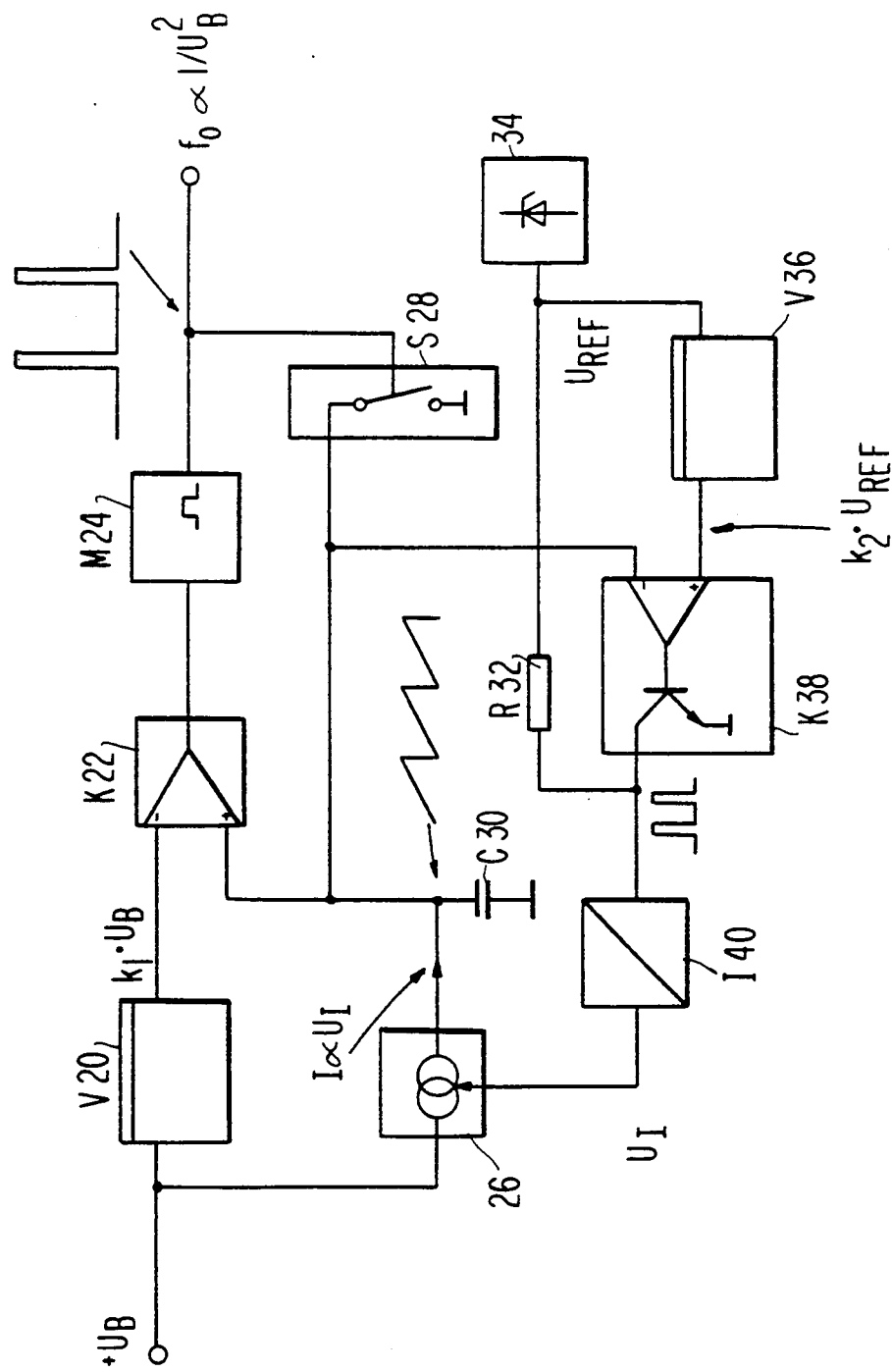
FIG. 2 shows a preferred embodiment of the oscillator indicated in FIG. 1.

FIG. 2 shows a basic circuit diagram of a circuit arrangement with which a frequency which is inversely proportional to the square of the operating voltage $U_B$ is generated.

The operating voltage $U_B$ is available at an input of an amplifier circuit V20, which multiplies the operating voltage $U_B$ by a factor $K_1$, which is less than 1.

The output of the comparator K22 is connected to the trigger input of a monoflop (monostable multivibrator circuit) M24, at the output of which pulses with the desired output frequency $f_o$ are available.

For the operation of a switch S28, which is preferably designed as an electronic switching element, the output of the monoflop M24 is connected to the latter. One terminal of the switch S28 is connected to ground, the other is connected to the non-inverting input of the comparator K22 and one terminal of a capacitor C30, the other terminal of which is connected to, ground. Furthermore, the common terminal of the capacitor C30 and of the switch S28 is connected to the inverting input of a further comparator K38, which is designed as an open-collector comparator.

From a reference voltage source 34, which may be designed for example as a Zener diode a reference voltage $U_{REF}$ is delivered, and for this purpose the output of the reference voltage source 34 is connected to the input of a further amplifier circuit V36 and also to a terminal of a resistor R32, the other terminal of which is connected to the output of the comparator K38. The amplifier element V36 amplifies the reference voltage $U_{REF}$ by a factor $k_2$, which may be greater than or less than 1. The output of the amplifier component V36 is connected to the non-inverting input of the second comparator K38. The output terminal of the comparator K38 leads to a schematically represented integrating element I40, at the output of which a voltage $U_I$ is available. This voltage is passed to a voltage-controlled constant current source 26, the input of which is connected to the operating voltage $U_B$ and the output of which is connected to the capacitor C30. The constant current source 26 therefore delivers to the capacitor C30 a current I which is proportional to the output voltage U of the integrator I40.

The capacitor C30 is charged from zero volts with the current I. In the comparator K22, the voltage of the capacitor C30 is compared with the voltage $k_1 \cdot U_{kB}$, proportional to the supply voltage. If these two voltages are equal, the comparator K22 switches and triggers the monoflop M24, which emits a short pulse. This short pulse operates the switch S28 and leads to a rapid discharge of the capacitor C30. Thereupon, the charging process for the capacitor C30 recommences and this leads to the generation of a sawtooth voltage at the capacitor C30. The following applies for the charging time of the capacitor C30:

$$k_1 U_B = (I \cdot T_A)/C30 \qquad (5)$$

In the second comparator K38, the voltage of the capacitor C30 is compared with the voltage $k_2 \cdot U_{REF}$, proportional to the reference voltage $U_{REF}$, which is less than the voltage $K_1 \cdot U_B$. From the time $t = 0$ until the switching-over point of the comparator K38 there is the reference voltage $U_{REF}$ at its output, thereafter the voltage 0. The following applies for the switching-over point $T_S$:

$$k_2 U_{REF} = (I \cdot T_s)/C30 \qquad (6)$$

The following applies for the output voltage $U_I$ of the integrator I40:

$$U_I = \frac{1}{T_A} \int_0^{T_s} U_{REF} \, dt = \frac{T_s}{T_A} U_{REF} \qquad (7)$$

It follows from these equations that:

$$\frac{T_s}{T_A} = \frac{k_2 \, U_{REF}}{k_1 \, U_B} \qquad (8)$$

and with equation (7)

$$U_I = \frac{k_2 \, U_{REF}^2}{k_1 \, U_B} \qquad (9)$$

Since the current I, with which the capacitor C30 is charged, is proportional to the voltage $U_I$, the following consequently applies:

$$k_1 \, U_B \sim \frac{k_2 \, U_{REF}^2}{k_1 \, U_B} \cdot \frac{T_A}{C30} \qquad (10)$$

or $$T_A \sim C30 \frac{k_1{}^2 \, U_B{}^2}{k_2 \, U_{REF}^2} \qquad (11)$$

For the output frequency $f_o = 1/T_A$, then the desired proportionality applies $$f_o \sim \frac{1}{C30} \frac{k_2 \, U_{REF}^2}{k_1^2 \, U_B^2} \sim \frac{1}{U_B^2} \qquad (12)$$

Consequently, this oscillator circuit is dependent on the operating voltage $U_B$ in its frequency at the output.

Figure 3:
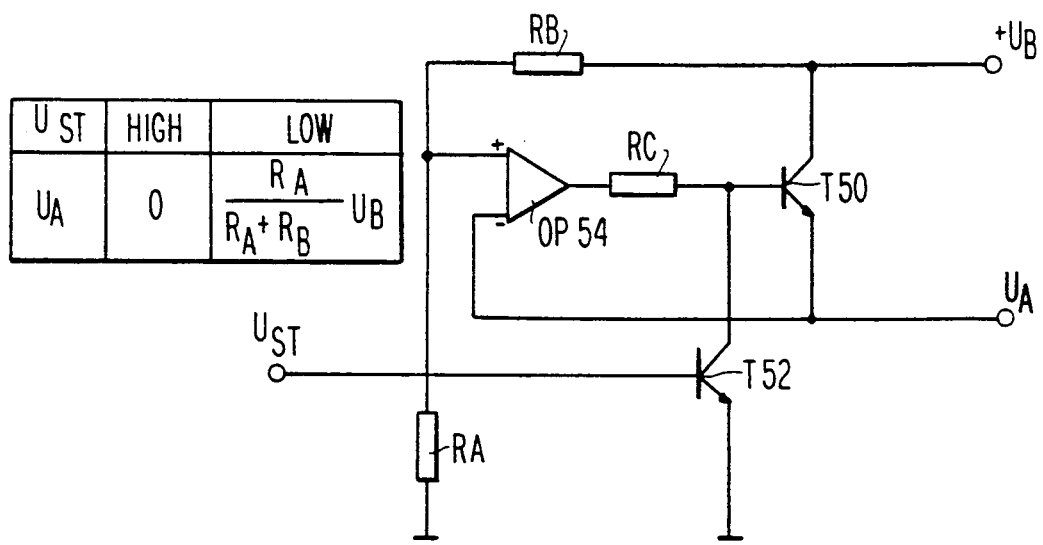
FIG. 3 shows a preferred embodiment of the switching device represented schematically as a switch in FIG. 1.

In FIG. 3, an advantageous embodiment for the switch S14 only schematically represented in FIG. 1 is represented. The control voltage $U_{ST}$ is at the base of an NPN transistor T52, the emitter of which is connected to ground and the collector of which is connected to the base of a further NPN transistor T50. Furthermore, the base of the transistor T50 is connected via a resistor RC to the output of an operational amplifier OP54. At the non-inverting input of the operational amplifier OP54, via a resistor RB, there is the positive operating voltage $U_B$, and this input of the operational amplifier OP54 is, furthermore, connected to one terminal of a resistor RA, the other terminal of which is connected to ground. The inverting input of the operational amplifier OP54 is connected to the emitter of the transistor T50 and to an output terminal for the delivery of an output voltage $U_A$. The collector of the transistor T50 is connected to the operating voltage $U_B$.

The operational amplifier OP54 and the transistor T50 form a voltage follower, which switches a voltage proportional to $U_B$ to the bridge circuit represented in FIG. 1. Due to the power of the transistor T50, a switching occurs at a voltage which is just below the voltage ($U_B - U_{SAT}$), $U_{SAT}$ being the saturation voltage of the transistor T50. As a result, the desired proportionality to the reciprocal of the square of the operating voltage $U_B$ is ensured.

In the table of FIG. 3A, the switching states of the device of FIG. 3 are illustrated with reference to the voltages $U_{ST}$ and $U_A$.

Figure 4:
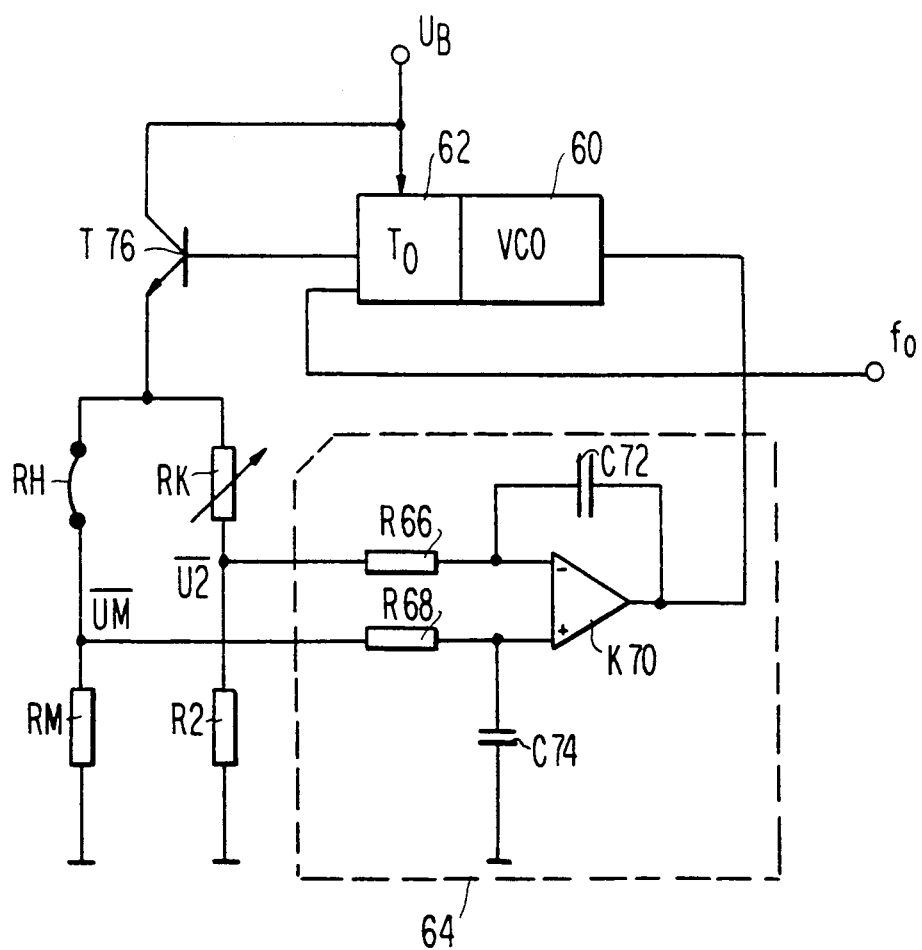
FIG. 4 shows a further embodiment of the oscil indicated in FIG. 1.

In FIG. 4, a further embodiment of a circuit arrangement of is indicated, wherein the duration of high output pulses generated by frequency $f_o$ by the oscillator having the invention has the desired proportionality to the reciprocal of the square of the operating voltage $U_B$. For this purpose, in the case of the circuit arrangement according to the invention represented in FIG. 4, a voltage-controlled oscillator (VCO) 60 is provided, which is controlled by a time-control circuit 62, explained in further detail below.

Similarly as in the case of the circuit represented in FIG. 1, in the circuit arrangement according to FIG. 4 four resistors RH, RM, RK and R2 are arranged in a bridge circuit. This bridge circuit is supplied with power via a transistor T76. For this purpose, the emitter of the transistor T76 is connected to the upper terminal of the bridge circuit, the collector of the transistor T76 is connected to the operating voltage $U_B$, which is likewise connected to the time-control element 62, and, for operation of the transistor T76, its base is connected to the time-control element 62.

The diagonal voltage of the bridge circuit is applied in one branch via a resistor R66 to the inverting input of a comparator K70, which is connected via a capacitor C72 to the output of the comparator K70. The other branch of the bridge circuit is connected via a resistor R68 to the non-inverting input of the comparator K70, to which there is likewise connected a further capacitor C74, the other terminal of which is connected to ground. For the control of the voltage-controlled oscillator 60 the output of the comparator K70 is connected to the latter.

The complete arrangement of the resistors R66, R68, the capacitors C74, C72 and the comparator K70 represents an integrator 64 with a differential input.

The circuit represented in FIG. 4 controls in such a way that the average voltage $\overline{U}_M$ is approximately equal to the average voltage $\overline{U}_2$, consequently the square-wave voltages $U_M$ and $U_2$ are filtered and compared. The output voltage of the differential integrator 64 controls the voltage-controlled oscillator 60 such that the bridge circuit is balanced. The output signal $f_o$ of the voltage-controlled oscillator is such that the frequency is a function of the air mass flowing around the hot-wire resistor RH, while the on duration of these pulses is controlled as a function of the operating voltage $U_B$ in order to make the heat output produced at the hot-wire resistor RH independent of the operating voltage $U_B$.

Figure 5:
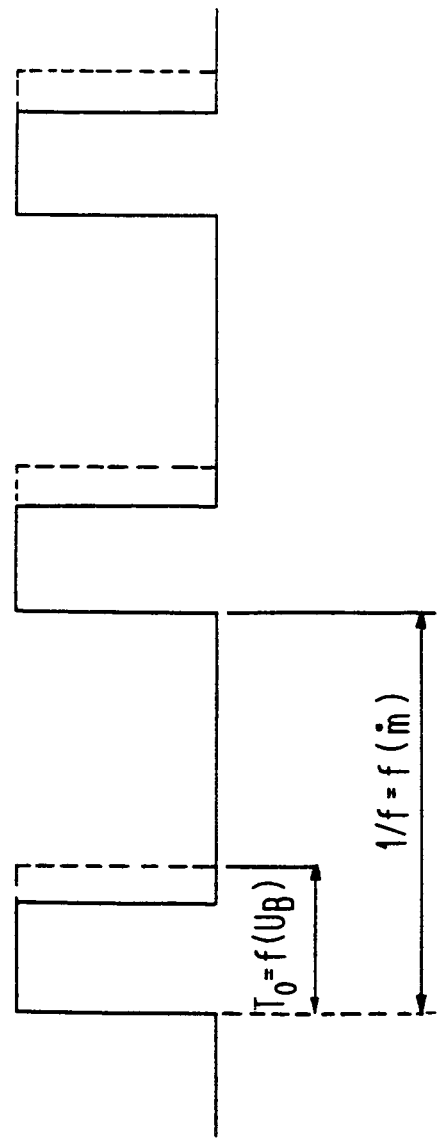
FIG. 5 shows a timing diagram for the circuit according to FIG. 4.

This is illustrated schematically in the time sequence diagram of FIG. 5. It can be seen that the interval of time intervals to between the turn-on edges of the pulses of the output signal $f_o$ of the voltage-controlled oscillator 60 vary only in the desired way, as a function of the air mass. If there is a change in the level of the operating voltage $U_B$ on the other hand, the duration Ti of the individual pulses changes in a corresponding way as a function $f(U_B) = C/U_B^2$, as is indicated in FIG. 5 by lengthened pulses (broken lines).

Figure 6:
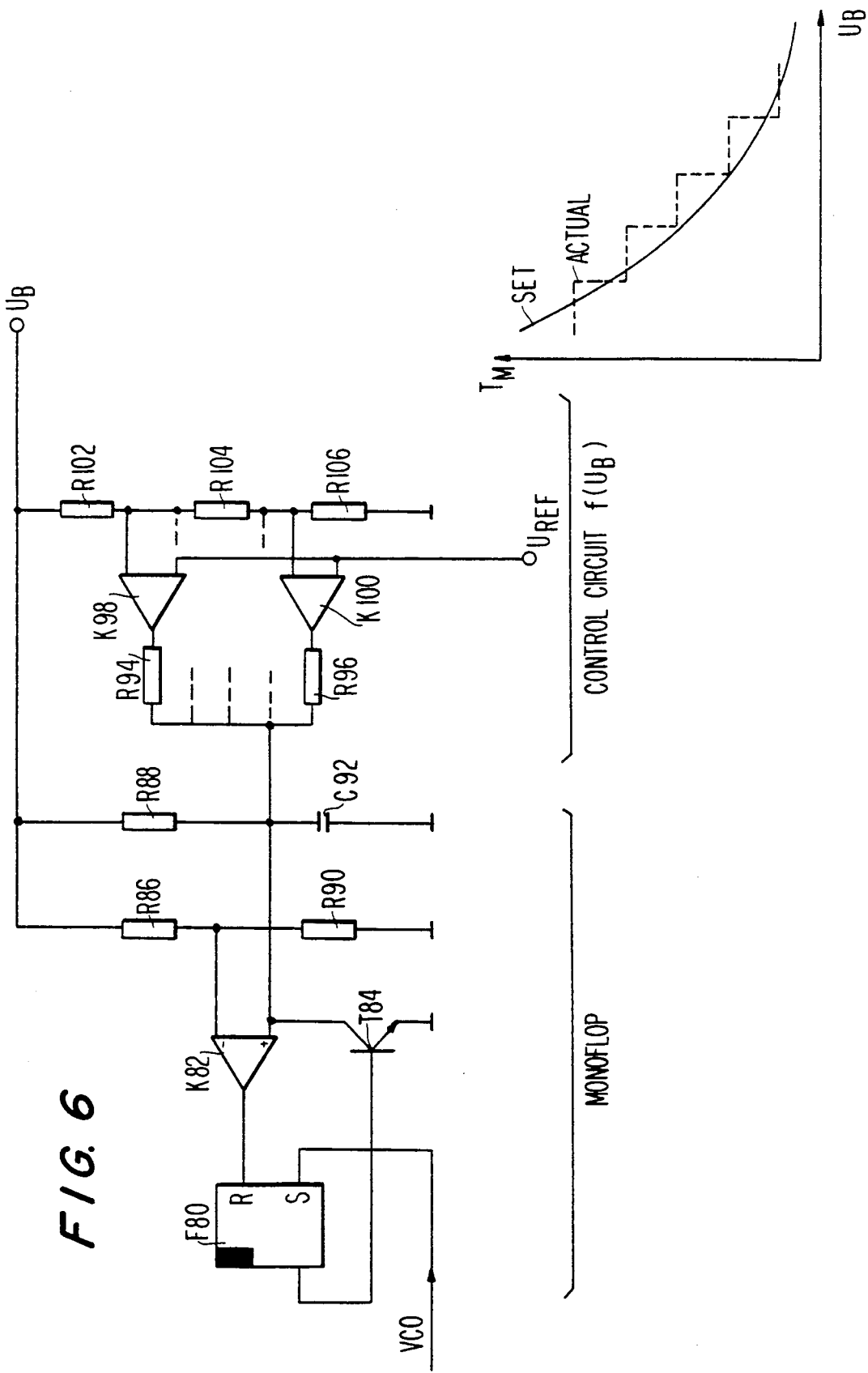
FIG. 6 shows a first embodiment of a time-control circuit for the voltage-controlled oscillator according to FIG. 4.

In FIG. 6, a first embodiment of a control circuit is indicated, with which the control of the $T_o$ as a function of the operating voltage $U_B$, necessary for the circuit shown in FIG. 4, can be achieved.

For this purpose, a monoflop (monostable multivibrator circuit) is provided with a resistor network. To be specific, the voltage-controlled oscillator VCO is connected to the set input S of a flip-flop 80, the reset input R of which is connected to the output of a comparator K82. The output of the flip-flop F80 is connected to the base of a transistor T84, the emitter of which is connected to ground and the collector of which is connected to the non-inverting input of the comparator K82. The inverting input of the comparator K82 leads to a voltage-divider circuit of resistors R86, R90, the other terminal of the resistor R90 being connected to earth and the other terminal of the resistor R86 being connected to the operating voltage $U_B$.

Also connected to the operating voltage $U_B$ is one terminal of a resistor R88, the other terminal of which is connected to the non-inverting input of the comparator K82, a capacitor C92, the other terminal of which is connected to ground, and is connected to the input of the resistor network, of which two resistors R94, R96 are represented by way of example. Further line paths of this resistor network are indicated by broken lines.

Each of the resistors R94, R96 is connected to the output of an associated comparator K98 and K100, respectively. One input of the comparators K98, K100 is in each case connected to a reference voltage $U_{REF}$. The respective other input of the comparators K98, K100 is connected to a voltage divider, which consists of a resistor chain R102, R104, R106, the resistor chain being connected at one end to ground and at the other end to the operating voltage $U_B$.

The plot diagram in FIG. 6 the dependence of the switch on time $T_M$ of the monoflop on the operating voltage $U_B$ how the desired or nominal approximation (full line curve) is actually realized by the resistor network (broken line curve).

Figure 7:
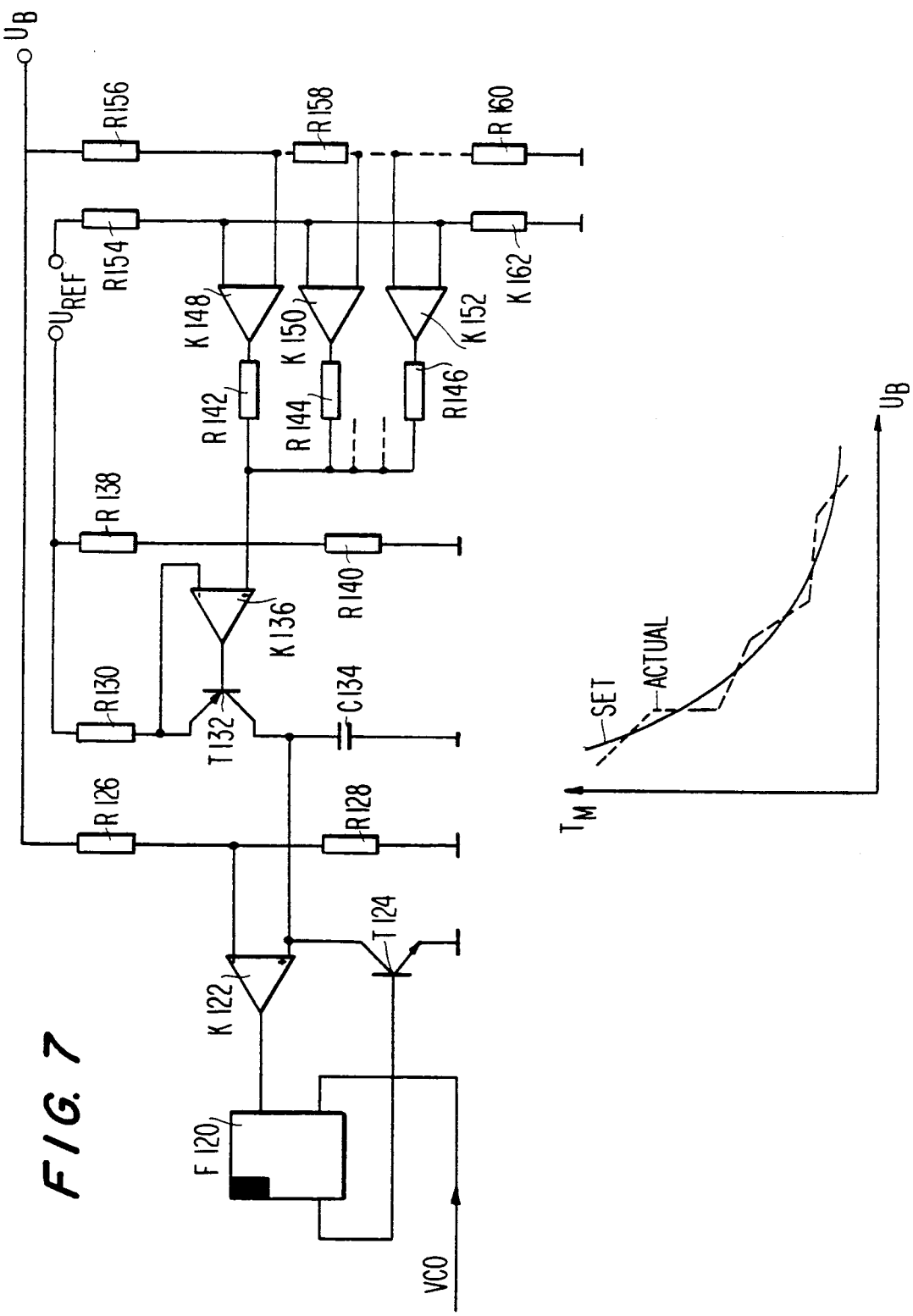
In FIG. 7 a second embodiment of a time-control circuit for the voltage-controlled oscillator indicated in FIG. 4 is represented, with improved approximation of the reciprocal of the square of the operating voltage in comparison with the circuit represented in FIG. 6.

An improvement in this approximation can be realized with the further embodiment of the invention represented in FIG. 7 in which, as indicated in the plot diagram at the bottom of the Figure, an approximation of the desired function $1/U_B^2$ is performed by functions $1/U_B$.

The left part of the circuit of FIG. 7 corresponds essentially to the monoflop represented in FIG. 6 and induce a flip-flop 120 to which are connected are the voltage-controlled oscillator (VCO), the output of a comparator K122 and the base of a transistor 124. The collector of the transistor T124 is connected to the non-inverting input of the comparator K122 and the emitter is connected to ground. The inverting input of the comparator K122 is connected to a voltage divider circuit of resistors R126, R128, which is connected on the one hand to ground and on the other hand to the operating voltage $U_B$.

At the non-inverting input of the comparator K122 there is a network which differs from the network represented in FIG. 6. Firstly, here the collector of a transistor T132 and one terminal of a capacitor C134 are connected, the other terminal of which is connected to ground. The emitter of the transistor T132 is connected to the inverting input of the comparator K136 and to one terminal of a resistor R130, the other terminal of which is connected to a resistor R138 and to a reference voltage source $U_{REF}$. The output of the comparator K136 leads to the base of the transistor T132.

The non-inverting input of the comparator K136 leads to a voltage divider circuit of the resistor R138 and a further resistor R140, the other terminal of which is connected to ground.

Furthermore, the non-inverting input of the comparator K136 is connected to a network of resistors, of which three resistors R142, R144 and R146 are represented in full lines and further resistors are indicated by broken lines. The other terminal of these resistors leads in each case to the output of an associated comparator K148, K150, K152. One input of the comparators K148, K150 and K152 is connected to a voltage divider chain R156 to R160, the one end of which is connected to ground and the other end of which is connected to the $U_B$. The other input of the comparators K148, K150, K152 is connected to a voltage divider R154 and R162,m the one end of which is connected to ground and the other end of which is connected to the reference voltage $U_{REF}$.

The approximation of the desired or nominal function $1/U_B^2$ (full line curve) by functions $1/U_B$, (broken line) produced with the circuit arrangement according to FIG. 7, is illustrated in the plot diagram of FIG. 7a which is similar to FIG. 6a.

I claim:

1. Circuit arrangement with a flow probe connected in a bridge circuit which is power supplied by a source of operating voltage ($U_B$), comprising
a device for determining bridge balance;
an oscillator circuit controlled by the operating voltage ($U_B$) to deliver an operating frequency ($f_o$) which is at least approximately inversely proportional to the square of the operating voltage;
a triggering circuit controlled by the oscillator circuit and the bridge balance determining device to deliver control pulses ($U_{ST}$) whose duration ($T_i$) within time intervals ($T_o$) of respective cycles of the operating frequency ($f_o$) is a function ($f(\dot{m})$) of low rate sensed by the flow probe; and
a switching device connected between the operating voltage source and the bridge circuit, the switching device being controlled by the control pulses ($U_{ST}$) to apply to the flow probe an average power which is independent of fluctuation of the operating voltage ($U_B$).

2. Circuit arrangement according to claim 1, wherein for the generation of the operating frequency ($f_o$), an oscillator circuit is provided in which a first comparator circuit (K22) and a second comparator circuit (K38) are provided, one input of the respective comparator circuits being connected to a capacitance (C30) and the other input to a first voltage source (V20) and a second voltage source (V36), respectively, a multivibrator circuit (M24) for the emission of the operating frequency ($f_o$) being triggered by the first comparator circuit (K22); and a controllable current supply circuit (I40, 26) for charging the capacitance (C30) being controlled by the second comparator circuit (K38).

3. Circuit arrangement according to claim 2, characterized in that a voltage ($K_1 \times U_B$) proportional to the operating voltage ($U_B$) is emitted from the first voltage source (V20) and a voltage ($K_2 \times U_{REF}$) proportional to a reference voltage ($U_{REF}$) is emitted from the second voltage source (V36), in that the second comparator circuit (K38) is followed by an integrator circuit (I40), the output signal ($U_I$) of which drives a controllable current source (26), the output of which is connected to the capacitance (C30), and in that a switching element (S28) for discharging the capacitance (C30) is controlled by the multivibrator circuit (M24).

4. Circuit arrangement according to claim 3, characterized in that the multivibrator circuit is a monostable multivibrator circuit (M24).

5. Circuit arrangement according to one of claims 4 to 4, characterized in that an isolation amplifier which has an operational amplifier (OP54) with following transistor (T50) is provided as switching device.

6. Circuit arrangement with a flow probe connected in a bridge circuit which is power supplied by a source of operating voltage ($U_B$), comprising
a device for determining bridge balance;
a voltage-controlled oscillator controlled by the bridge balance determining device to deliver at its output high pulses at an operating frequency ($f_o$) which is a function ($f(\dot{m})$) of flow rate sensed by the flow probe;
a time control circuit (62) connected to the source of operating voltage ($U_B$) and to the output of the oscillator to control the duration ($T_i$) of the respective high pulses such as to be at least approximately inversely proportional to the square of the operating voltage; and
a switching device connected between the operating voltage source and the bridge circuit, the switching device being actuated by the high pulses delivered by the time control circuit to apply to he flow probe an average power which is independent of fluctuations of the operating voltage ($U_B$).

7. Circuit arrangement according to claim 6, characterized in that a differential integrating element (64), connected to the bridge circuit (RH, RM, RK, R2), is provided, the output of which element is connected to the input of the oscillator (60).

8. Circuit arrangement according to claim 6 or 7, characterized in that the time control circuit has a resistor network (R94, R96, R102, R104), which is provided with comparator circuits (K98, K100), the one input of which is connected in each case via at least one of the resistors (R102, R104) to the source of operating voltage ($U_B$) and the respective other input of which is connected to a reference voltage source ($U_{REF}$).

9. Circuit arrangement according to claim 6 or 7, characterized in that the time control circuit has a resistor network (R142, R144, R146, R154, R156, R158, R160, R162), which is provided with comparator circuits (K148, K150, K152), the one input of which is connected in each case via at least one of the resistors (R156, R158, R160) to the operating voltage ($U_B$) and the respective other input of which is connected directly or indirectly (R154) to a reference voltage source ($U_{REF}$), the other terminal of which is connected via a voltage divider (R138, R140), together with the output of the resistor network, to a terminal (+) of a comparator circuit (K136) and via a resistor (R130) to the other terminal (−) of the latter, which is connected to a switching element (T132) which is operable by the output of the comparator circuit (K136).

* * * * *